United States Patent
Du et al.

(10) Patent No.: US 9,989,575 B2
(45) Date of Patent: Jun. 5, 2018

(54) DETECTION OF ECU GROUND FAULT WITH CAN BUS VOLTAGE MEASUREMENTS

(71) Applicant: GM GLOBAL TECHNOLOGY OPERATIONS LLC, Detroit, MI (US)

(72) Inventors: Xinyu Du, Oakland Township, MI (US); Shengbing Jiang, Rochester Hills, MI (US); Atul Nagose, Royal Oak, MI (US); David B. Gumpert, Farmington Hills, MI (US); Aaron B. Bloom, Sterling Heights, MI (US); Rod Niner, Royal Oak, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 292 days.

(21) Appl. No.: 14/837,641

(22) Filed: Aug. 27, 2015

(65) Prior Publication Data

US 2016/0320441 A1    Nov. 3, 2016

Related U.S. Application Data

(60) Provisional application No. 62/154,879, filed on Apr. 30, 2015.

(51) Int. Cl.
*G01R 31/02* (2006.01)
*H04L 1/24* (2006.01)
*G01R 31/00* (2006.01)

(52) U.S. Cl.
CPC .............. *G01R 31/025* (2013.01); *H04L 1/24* (2013.01); *G01R 31/007* (2013.01)

(58) Field of Classification Search
None
See application file for complete search history.

(56) References Cited

U.S. PATENT DOCUMENTS

| | | | |
|---|---|---|---|
| 2004/0158781 A1* | 8/2004 | Pihet ................. | H04L 12/40013 714/712 |
| 2008/0186870 A1* | 8/2008 | Butts .................. | H04L 41/0659 370/252 |
| 2009/0183033 A1* | 7/2009 | Ando .................. | H04L 43/0823 714/43 |
| 2015/0312123 A1* | 10/2015 | Zhang ................. | G06F 11/0745 709/224 |

(Continued)

*Primary Examiner* — Tom Thomas
*Assistant Examiner* — Steven B Gauthier
(74) *Attorney, Agent, or Firm* — Reising Ethington, P.C.

(57) ABSTRACT

A method is disclosed for detecting ground faults in a communications system. The method includes measuring a predetermined number of voltage points; determining if the measured voltage points represent recessive or dominant bits; identifying which of the predetermined number of voltage points represent inter-frame bits and which represent frame data bits based on whether the measured voltage points are recessive or dominant; calculating a maximum average voltage for the inter-frame bits; calculating an average frame voltage for all dominant bits within a frame; determining a high average dominant voltage count based on a number of frames for which the average frame voltage is greater than a high voltage threshold; and determining if a ground fault exists based on the average frame voltage and the high average dominant voltage count.

13 Claims, 6 Drawing Sheets

(56) References Cited

U.S. PATENT DOCUMENTS

2015/0346259 A1* 12/2015 Jiang .................. H04L 43/0811
  324/538
2015/0346260 A1* 12/2015 Jiang .................. G06F 11/0739
  324/538

* cited by examiner

FIGURE 3A
Simplified equivalent circuit (Floating Ground Fault)

FIGURE 3B
Simplified equivalent circuit (Ground Offset)

DETECTION OF ECU GROUND FAULT WITH CAN BUS VOLTAGE MEASUREMENTS

CROSS-REFERENCE TO RELATED APPLICATIONS

This application claims the benefit of U.S. provisional patent application No. 62/154,879, filed on Apr. 30, 2015, the entire contents of which are hereby incorporated by reference.

TECHNICAL FIELD

The present invention relates generally to ground fault detection, and more particularly, to detecting and isolating ground faults in electronic control units (ECUs) using network bus voltage measurements.

BACKGROUND

A modern automobile has numerous electronic control units (ECUs) configured to control various vehicle subsystems, such as the engine, transmission, airbags, antilock braking, cruise control, electric power steering, audio systems, windows, doors and mirror adjustments, to name but a few. Some of these subsystems are independent, while others need to exchange data among themselves during the normal operation of the vehicle. For example, the engine needs to tell the transmission the engine speed, and the transmission needs to tell other modules when a gear shift occurs. When an ECU fails or is operational but faulty, the vehicle may exhibit poor performance or be completely disabled. The problem, however, may not originally stem from the ECU itself, but rather a ground fault on the communications network that interconnects the ECUs. In other words, there may be a fault on a communication line rather a fault with the ECU itself. Often times ground faults, which can be difficult to detect even using service station diagnostics, can manifest as ECU faults. Consequently, service stations sometimes unnecessarily replace ECUs in an attempt to determine and solve the problem.

The system and method described hereinafter reduces troubleshooting time, avoids unnecessary ECU replacement, and decreases repeated repair visits by detecting and isolating ground faults prior to an ECU failure.

SUMMARY

According to an embodiment of the invention, there is provided a method for detecting ground faults in a communications system. The method includes measuring a predetermined number of voltage points; determining if the measured voltage points represent recessive or dominant bits; identifying which of the predetermined number of voltage points represent inter-frame bits and which represent frame data bits based on whether the measured voltage points are recessive or dominant; calculating a maximum average voltage for the inter-frame bits; calculating an average frame voltage for all dominant bits within a frame; determining a high average dominant voltage count based on a number of frames for which the average frame voltage is greater than a high voltage threshold; and determining if a ground fault exists based on the average frame voltage and the high average dominant voltage count.

BRIEF DESCRIPTION OF THE DRAWINGS

One or more embodiments of the invention will hereinafter be described in conjunction with the appended drawings, wherein like designations denote like elements, and wherein.

DETAILED DESCRIPTION OF THE ILLUSTRATED EMBODIMENT(S)

The system and method described below are configured to detect and isolate floating ground and/or ground offsets, collectively ground faults, in a communications network using bus voltage measurements. While the approach and methodology are described below with respect to vehicle communications, one of ordinary skill in the art appreciates that an automotive application is merely exemplary, and that the concepts disclosed herein may also be applied to any other suitable communications system such as, for example, general industrial automation applications and gaming, to name a few. The term vehicle as described herein is also to be construed broadly to include not only a passenger car, but any other vehicle including, but not limited to, motorcycles, trucks, sports utility vehicles (SUVs), recreational vehicles (RVs), marine vessels, and aircraft. The system and method described herein may be implemented on-board a vehicle, or in off-board service tools, and is capable of detecting both intermittent and permanent ground faults. As such, the method described herein may be implemented on a service tool rather than on an ECU or gateway. In addition, although described below with respect to a communications system that incorporates ECUs, one of ordinary skill in the art appreciates that the method disclosed herein is equally applicable to any communication system utilizing a two wire differential bus.

One of the first and most widely established network bus protocols is the controller-area network (CAN or CAN-bus), which is a multi-master broadcast serial bus standard designed to allow microcontrollers and devices to communicate with each other within the vehicle. The most common physical layer standard in the CAN protocol, used here as exemplary, is a two-wire balanced signaling scheme defined by ISO-11898-2 (referred to as a high speed CAN). This standard specifies a two-wire differential bus wherein the number of nodes is limited by the electrical bus load. The two wires are identified as CAN_H (i.e., CAN High) and CAN_L (i.e., CAN Low). In one exemplary non-limiting embodiment, the characteristic line impedance is 120Ω, and the common mode voltage ranges from −2 V on CAN_L to +7 V on CAN_H. More specifically, the voltage on CAN Low is generally in the range of 1.5 V to 2.5 V, while the voltage on CAN High is generally in the range of 2.5 V to 3.5 V. Each node (i.e., ECU) on the CAN-bus is able to send and receive messages, but not simultaneously. The messages include an ID that represents the priority of the message. This mechanism is referred to as priority based bus arbitration. Messages with numerically smaller ID values have a higher priority than larger ID values and are therefore transmitted first.

The CAN protocol also specifies two logical states: recessive and dominant. A differential voltage is used to represent the recessive and dominant states (i.e., bits). In the recessive state (logical 1), the differential voltage on CAN_H and CAN_L is less than a minimum threshold. In the dominant state (logical 0), the differential voltage on CAN_H and CAN_L is greater than a minimum threshold. Data in a CAN network is transmitted in messages, which are more commonly referred to as frames. Frames are separated from preceding frames by a bit field called an inter-frame space, which consists of at least three consecutive recessive bits. Following these consecutive recessive bits, if a dominant bit is detected, that bit is regarded as a "start of frame" bit for the next frame.

The system and method disclosed in the subject application utilizes two A-to-D converters to measure voltages on CAN_H and CAN_L, which are subsequently used to detect and isolate ground faults. More specifically, the disclosed method includes determining from the measured CAN bus voltages a voltage in the inter-frame region and an average voltage of a dominant bit within a frame, and then compares those inter-frame and in-frame voltages with predefined thresholds to detect and isolate floating ground and ground offset faults.

Figure 1:
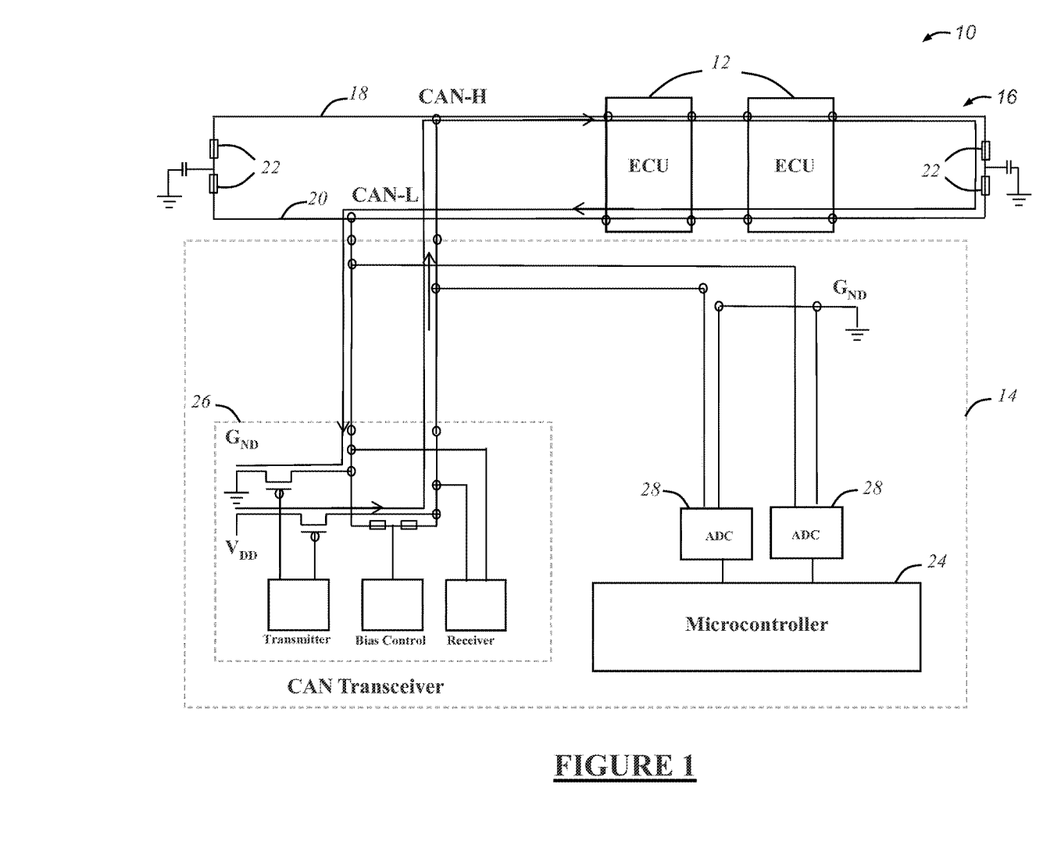
FIG. 1 is a block diagram depicting an embodiment of a communications system that is capable of utilizing the method disclosed herein.

With reference to FIG. 1, there is shown an exemplary vehicle communications system 10. The system 10 includes a plurality of ECUs 12 and a central gateway module 14 connected to a two-wire CAN-bus 16. The two wires comprising the CAN-bus are CAN_H (i.e., CAN High) 18 and CAN_L (i.e., CAN Low) 20, which terminate at each end with a terminating resistor 22. While the value of each terminating resistor may vary, an exemplary value may be 60Ω, or 120Ω if a split termination is not utilized.

As set forth above, the CAN is a bus standard designed to allow microprocessors and devices to communicate with each other using a message-based protocol. In an automotive application, a vehicle may contain as many as 80 ECUs for controlling various subsystems and may be connected by a plurality of CAN-bus systems. For simplicity purposes, FIG. 1 illustrates only two ECUs 12 connected to a central gateway module (CGM) 14, which is an ECU that connects to all ECUs on a particular CAN-bus, but also has the ability to serve as a gateway to multiple CAN-buses (not shown) on the network. One of ordinary skill in the art understands that multiple configurations of a CAN network are known and that the configuration shown in FIG. 1 is exemplary and non-limiting.

Referring to the CGM 14 in FIG. 1, each ECU on a CAN network generally includes a processor or microcontroller 24, a CAN controller (not shown), and a transceiver 26. The microcontroller 24 controls the relay of messages and is connected to various sensors, actuators, and control devices. The CAN controller is often an integral part of the microprocessor and is configured to store the received serial bits from the CAN-bus until an entire message is available, which can then be fetched by the microcontroller 24. The CAN controller is also configured to receive messages transmitted by the microprocessor, which are then serially transmitted as bits onto the CAN-bus 16. The transceiver 26 converts the data stream from CAN-bus levels to levels that the CAN controller 24 can process, and vice versa. The transceiver may also contain circuitry to protect the CAN controller 24.

Two A-to-D converters 28 are used to measure voltages on CAN High and CAN Low. As shown in FIG. 1, these converters 28 are part of the CGM 14, but can be equally located on any other ECU 12 on the CAN-bus 16. The A-to-D converters 28 are communicatively coupled to microcontroller 24, which controls the functionality of the converters 28 and implements the disclosed method for detecting ground faults.

Figure 2A:
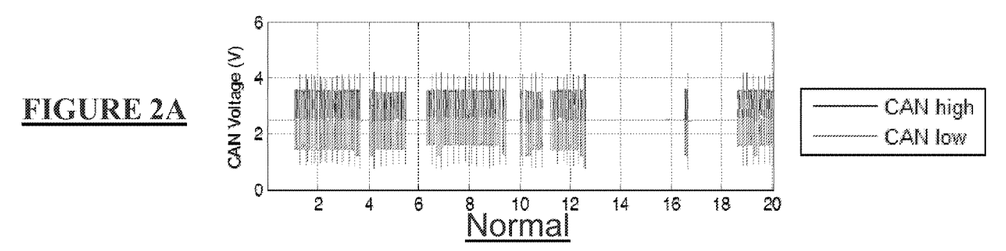
FIGS. 2A-C illustrate exemplary ground fault signatures.

The system 10 illustrated in FIG. 1 is configured to detect and isolate ground faults including floating ground and ground offsets. FIGS. 2A-C, 3A, and 3B illustrate the various fault signatures and their simplified equivalent circuits. As a baseline, FIG. 2A illustrates a CAN voltage signature when all ECU grounds are normal with an average frame and inter-frame voltage being 2.5 V. As shown in each of FIGS. 2A-C, the top half of the signal that is above the 2.5 V line represents the voltage on CAN High, while the bottom half of the signal below the 2.5 V line represents the voltage on CAN Low.

Figure 2B:
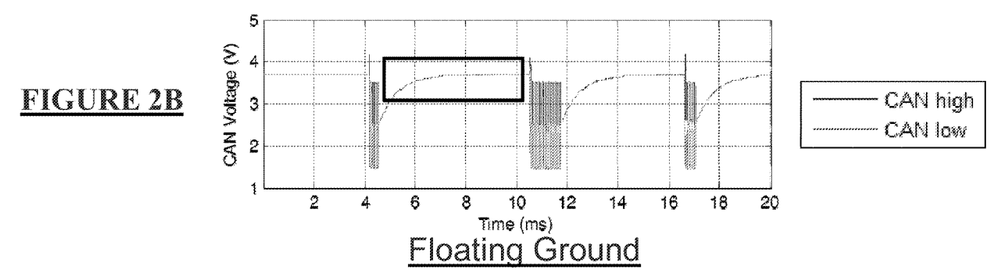
Figure 3A:
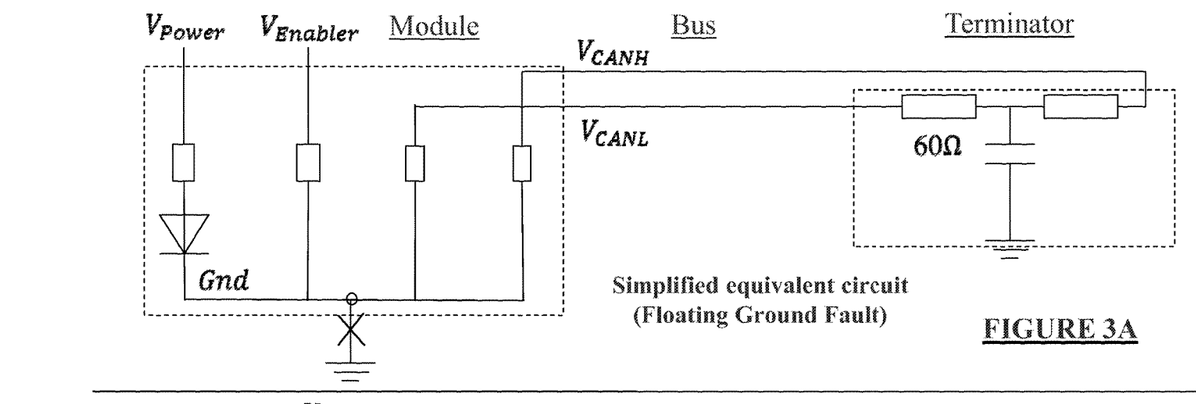
FIGS. 3A-B illustrate exemplary equivalent circuits for each ground fault condition.
Figure 3B:
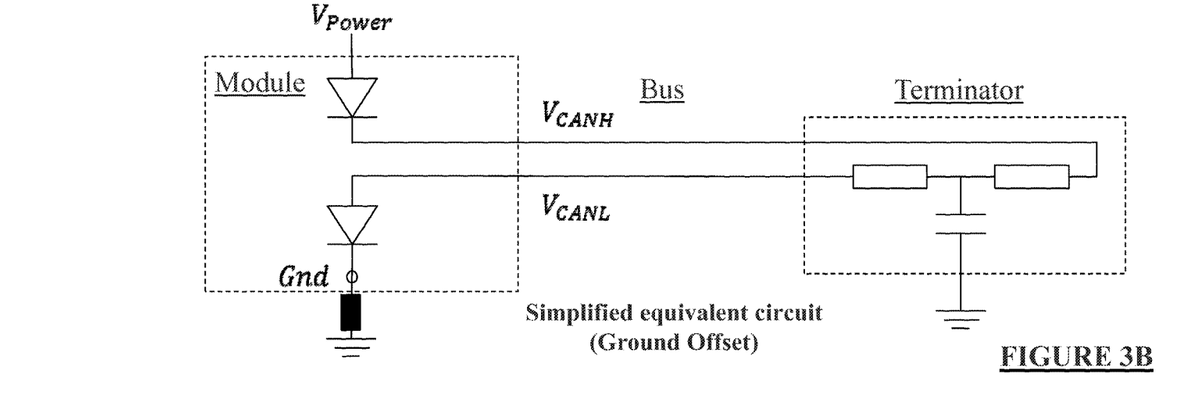

FIG. 2B illustrates the signature for a floating ground fault, which manifests in the inter-frame region when one or more ECU grounds is floating. FIG. 3A illustrates an exemplary simplified equivalent circuit of this condition where the voltage on the CAN-bus is pulled up when the connection to ground is disconnected. In this case, the ECUs with the floating ground fault stop sending messages, therefore, the voltage within the frame in not affected.

Figure 2C:
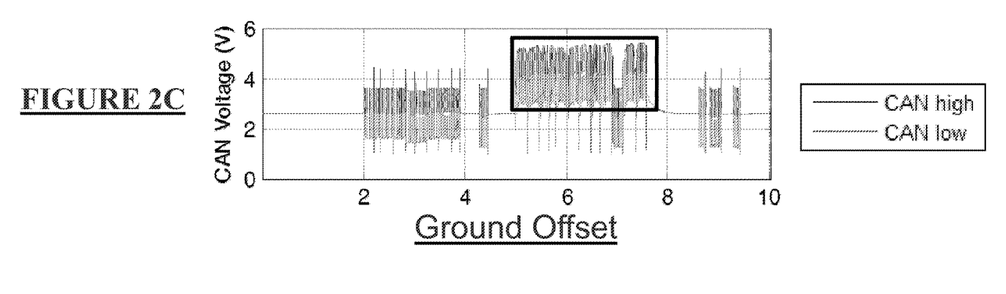

FIG. 2C illustrates the signature for a ground offset fault, which manifests in the frame region when one or more of the ECUs has a ground fault. FIG. 3A illustrates an exemplary simplified equivalent circuit of this condition where the voltage on the CAN-bus is pulled up as a result of the ECUs ground voltage being pulled up. In other words, the ground voltage becomes greater than zero, which causes both CAN High and CAN Low to be pulled up when the ECUs with the ground offset fault transmit frame data.

Figure 4:
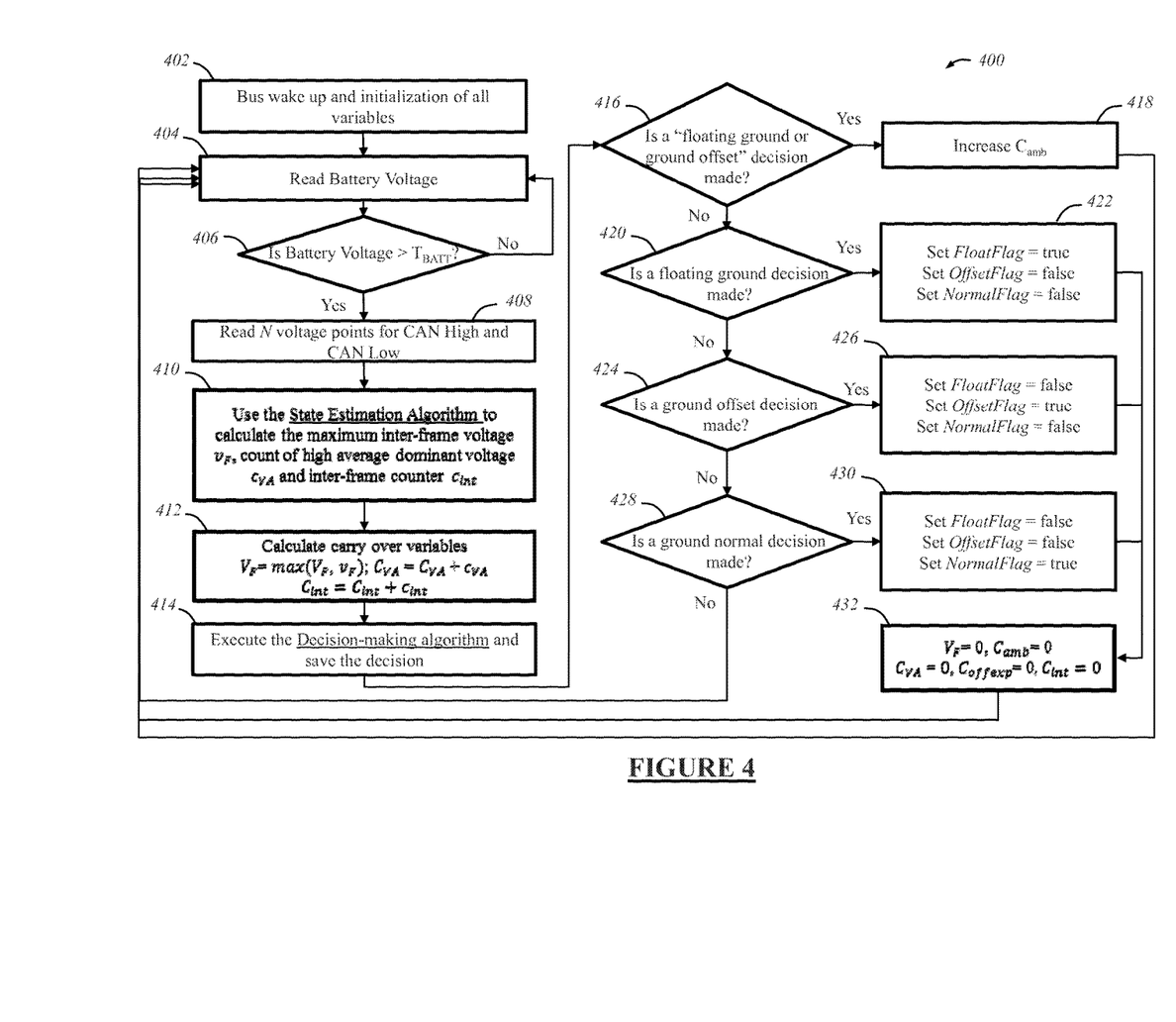
FIGS. 4-6 illustrate a method according to an embodiment of the invention for detecting and isolating ground faults.
Figure 5:
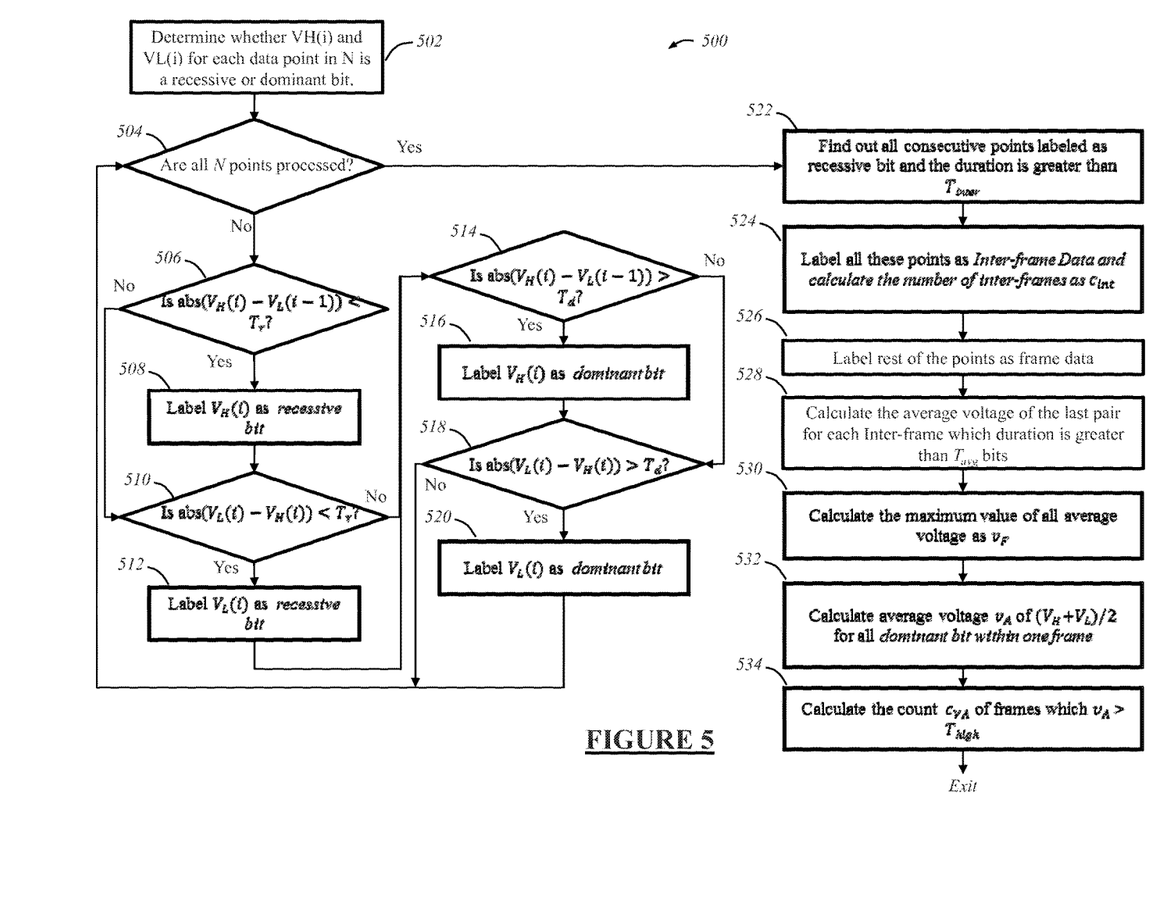
Figure 6:
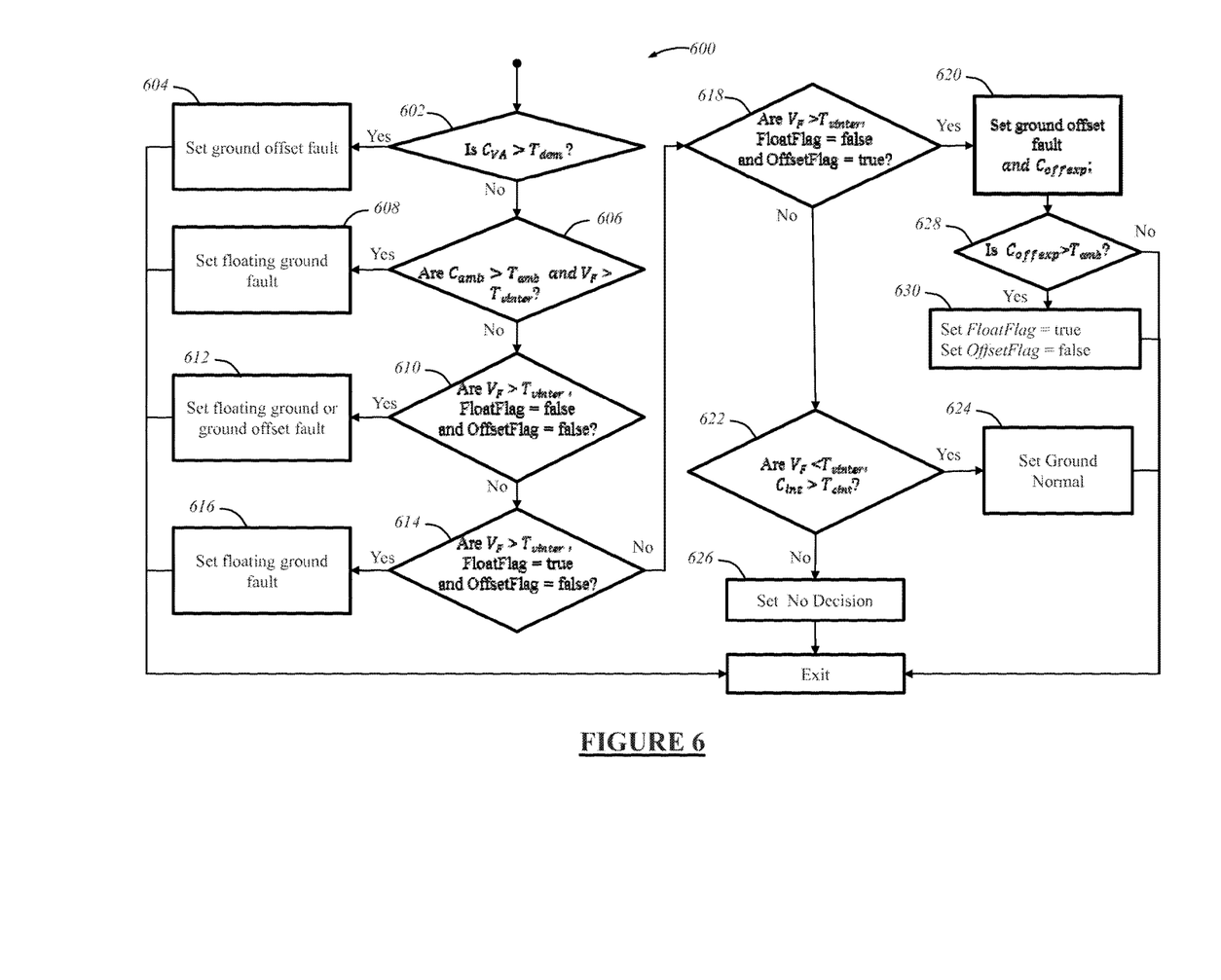

FIGS. 4-6 illustrate flow charts depicting an algorithm for detecting and isolating ground faults on a CAN-bus. Referring to FIG. 4, the algorithm 400 begins at step 402 by "waking up" the bus upon vehicle startup and initializing all variables to zero. At step 404, the microprocessor 24 reads the voltage of the vehicle battery, which supplies power to the ECUs 12, including CGM 14. At step 406, the battery voltage is compared to a battery voltage threshold $T_{BATT}$, which in one embodiment is 10 V, but may vary between 8-12 V depending on the particular application. If the battery voltage does not meet the battery voltage threshold $T_{BATT}$, the algorithm returns to step 404. If the battery voltage is greater than or equal to the battery voltage threshold $T_{BATT}$, the method 400 continues to step 408 where N voltage data points are measured on CAN High and CAN Low through the A-to-D converters 28. In other words, for each $N_i$ data point there are two voltage values, one for CAN High ($V_H(i)$) and one for CAN Low ($V_L(i)$). In one embodiment, N=1000, but may vary depending on the application and the size of the microprocessor 24 memory. At step 410, values are calculated for a maximum inter-frame voltage $v_f$, a count of high average dominant voltage $c_{va}$, and inter-frame counter $c_{int}$ using a state estimation algorithm 500 as shown in FIG. 5.

Referring to FIG. 5, the algorithm at step 502 determines whether $V_H(i)$ and $V_L(i)$ for each data point in N is a recessive or dominant bit. The determination begins at step 504 by evaluating whether all of the N voltage data points have been processed. If not, at step 506 the absolute value of the differential between $V_H(i)$ and $V_L(i-1)$ is calculated and compared to a recessive bit threshold $T_r$, which in one embodiment is 0.1 V. If the absolute value of the differential voltage calculated at step 506 is less than the recessive bit threshold $T_r$, then at step 508 $V_H(i)$ is labeled as a recessive bit. If the absolute value of the differential voltage calculated at step 506 is not less than the recessive bit threshold $T_r$, then at step 510 the absolute value of the differential between $V_L(i)$ and $V_H(i)$ is calculated and compared to the recessive bit threshold $T_r$. If the absolute value of the differential voltage calculated at step 510 is less than the recessive bit threshold $T_r$, then at step 512 $V_L(i)$ is labeled as a recessive bit. If the absolute value of the differential voltage calculated at step 510 is not less than the recessive bit threshold $T_r$, then at step 514 the absolute value of the differential between $V_H(i)$ and $V_L(i-1)$ is calculated and compared to a dominant bit threshold $T_d$. If the absolute value of the differential voltage calculated at step 514 is greater than the dominant bit threshold $T_d$, then at step 516 $V_H(i)$ is labeled as a dominant bit. If the absolute value of the differential voltage calculated at step 514 is not greater than the dominant bit threshold $T_d$, then at step 518 the absolute value of the differential between $V_L(i)$ and $V_H(i)$ is calculated and compared to the dominant bit threshold $T_d$. If the absolute value of the differential voltage calculated at step 518 is greater than the dominant bit threshold $T_d$, then at step 520 $V_L(i)$ is labeled as a dominant bit. If the absolute value of the differential voltage calculated at step 518 is not greater than the dominant bit threshold $T_d$, the method returns to step 504 to determine if all N data points have been processed.

If all N voltage data points have been processed at step 504, the method proceeds to step 522 at which point the algorithm identifies all consecutive data points that have been labeled as recessive bits and have a length or duration greater than an inter-frame threshold $T_{inter}$, which in one exemplary embodiment is 5 bits. At step 524, all of the consecutive points identified in step 522 are labeled as inter-frame data and the number of inter-frame data so identified is recorded in the inter-frame counter $c_{int}$. The remainder of the data points from step 522 than are not identified as inter-frame data are labeled as frame data at step 526. At step 528, the algorithm calculates an average voltage of the last pair for each inter-frame that has a duration or length greater than an average voltage threshold $T_{avg}$, which in one exemplary embodiment is 100 bits. At step 530, the maximum value of all of the average inter-frame voltages from step 528 is determined and designated as $v_f$. At step 532, an average voltage $v_a$ is calculated as $(V_H+V_L)/2$ for all dominant bits within one frame. At step 534, the algorithm determines a count for the high average dominant voltage $c_{va}$ frames that is greater than a high voltage threshold $T_{high}$, which in one exemplary embodiment is 3 V.

Referring again to FIG. 4, at step 112 the carry-over variables from the state estimation algorithm 500 are calculated. Specifically, values are calculated for the maximum inter-frame voltage $V_F$, the count of high average dominant voltage $C_{VA}$, and the inter-frame counter $C_{int}$, wherein $V_F$=max($V_F$, $v_f$); $C_{VA}$=$C_{VA}$+$c_{va}$; and $C_{int}$=$C_{int}$+$c_{int}$). These carry-over variables are moving averages that are continually updated. At step 414, a decision-making algorithm 600 as shown in FIG. 6 is executed.

Referring to FIG. 6, the algorithm 600 determines at step 602 whether the count for the high average dominant voltage $C_{VA}$ is greater than a dominant voltage count threshold $T_{dom}$, which in one exemplary embodiment is 3. If the count for the high average dominant voltage $C_{VA}$ is greater than the dominant voltage threshold $T_{dom}$, a ground offset fault is determined and a ground offset fault flag (i.e., OffsetFlag) is set to true at step 604. If the count for the high average dominant voltage $C_{VA}$ is not greater than the dominant voltage threshold $T_{dom}$, at step 606 it is determined whether an ambiguity decision counter $C_{amb}$ is greater than an ambiguity threshold $T_{amb}$, and whether the maximum inter-frame voltage $V_F$ is greater than an inter-frame voltage $T_{vinter}$, wherein in one exemplary embodiment the ambiguity threshold $T_{amb}$ is 500 and the inter-frame voltage $T_{vinter}$ is 2.65 V. If both of the conditions at step 606 are met, a floating ground fault is determined and a floating ground fault flag (i.e., FloatFlag) is set to true at step 608. If both conditions at step 606 are not met, then at step it is determined if the maximum inter-frame voltage $V_F$ is greater than the inter-frame voltage $T_{vinter}$ and both of the floating ground fault flag (i.e., FloatFlag) and the ground offset fault flag (i.e., OffsetFlag) are false. If all of the conditions at step 610 are satisfied, a floating ground or ground offset fault is determined and both are set to true at step 612. If all of the conditions at step 610 are not met, the algorithm proceeds to step 614 to determine if the maximum inter-frame voltage $V_F$ is greater than the inter-frame voltage $T_{vinter}$, the floating ground fault flag (i.e., FloatFlag) is true and the ground offset fault flag (i.e., OffsetFlag) is false. If all of the conditions at step 614 are satisfied, then a floating ground fault is determined and the floating ground fault flag (i.e., FloatFlag) is set to true at step 616. If all of the conditions at step 614 are not met, the algorithm proceeds to step 618 to determine if the maximum inter-frame voltage $V_F$ is greater than the inter-frame voltage $T_{vinter}$, the floating ground fault flag (i.e., FloatFlag) is false and the ground offset fault flag (i.e., OffsetFlag) is true. If all of the conditions at step 618 are satisfied, then a ground offset fault is determined and the ground offset fault flag (i.e., OffsetFlag) is set to true and a ground offset expiration counter $C_{offexp}$ is incremented at step 620. If all of the conditions at step 618 are not met, at step 622 it is determined if the maximum inter-frame voltage $V_F$ is less than an inter-frame voltage $T_{vinter}$ and the inter-frame counter $C_{int}$ is greater than a inter-frame counter threshold $T_{cint}$, which in one exemplary embodiment is 25. If both conditions at step 622 are met, then it is determined that the ground is normal and a ground normal flag (i.e., NormalFlag) is set to true at step 624. If both conditions at step 606 are not met, then no decision can be determined and a no decision flag is set at step 626. The algorithm 600 then determines at step 628 if the counter $C_{offexp}$ is greater than the ambiguity threshold $T_{amb}$. If not, the algorithm 600 exits to the main algorithm in FIG. 4. If the counter $C_{offexp}$ is greater than the ambiguity threshold $T_{amb}$ (indicating that a potential ground offset fault has disappeared), then the floating ground fault flag (i.e., FloatFlag) is set to true and the ground offset fault flag (i.e., OffsetFlag) is set to false at step 630. Thereafter, the algorithm 600 exits to the main algorithm in FIG. 4.

Referring again to FIG. 4, at step 116 algorithm 400 determines if neither a floating ground or ground offset decision has been made based on algorithm 600. In other words, has an ambiguity been determined and an ambiguity decision been made. If so, at step 418, the ambiguity decision counter $C_{amb}$ is increased, and the algorithm 400 returns to step 404. If not, at step 420 algorithm 400 determines if a floating ground decision has been made. If the floating ground decision has been made, at step 422 the floating ground fault flag (i.e., FloatFlag) is set to true, the ground offset fault flag (i.e., OffsetFlag) is set to false, and the normal ground flag (i.e., NormalFlag) is set to false. If the floating ground decision has not been made, at step 424, algorithm 400 determines if a ground offset decision has been made. If the ground offset decision has been made, at step 426 the floating ground fault flag (i.e., FloatFlag) is set to false, the ground offset fault flag (i.e., OffsetFlag) is set to true, and the normal ground flag (i.e., NormalFlag) is set to false. If the ground offset decision has not been made, at step 428, algorithm 400 determines if a ground normal decision has been made. If the ground normal decision has been made, at step 430 the floating ground fault flag (i.e., Float-Flag) is set to false, the ground offset fault flag (i.e., OffsetFlag) is set to false, and the normal ground flag (i.e., NormalFlag) is set to true. If the ground normal decision has not been made, the method returns to step 404. At the conclusion of steps 422, 426, 430, the algorithm proceeds to step 432 and resets to zero the maximum inter-frame voltage $v_f$, the count of high average dominant voltage $c_{va}$, the inter-frame counter $c_{int}$, the ambiguity decision counter $C_{amb}$, and the ground offset expiration counter $C_{offexp}$. Thereafter, algorithm 400 returns to step 404.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method for detecting ground faults in a vehicle communications system installed in a vehicle and having a plurality of electronic devices operatively and communicatively coupled by a two-wire differential bus that includes a low voltage line and a high voltage line, wherein the vehicle communications system uses the two-wire differential bus to communicate data between the plurality of electronic devices, the method comprising the steps of:
   measuring a predetermined number of bus voltage data points along the two-wire differential bus using an electronic device that includes an analog to digital converter and that is coupled to the two-wire differential bus, wherein each of the bus voltage data points include a first voltage measured from the low voltage line of the two-wire differential bus and a second voltage measured from the high voltage line of the two-wire differential bus;
   determining whether each of the predetermined number of bus voltage data points represent a recessive bit or a dominant bit through comparing the first voltage of the low voltage line and the second voltage of the high voltage line;
   identifying which of the predetermined number of bus voltage data points represent inter-frame bits and which represent frame data bits based on whether the predetermined number of bus voltage data points are determined to be recessive or dominant;
   calculating a maximum average voltage for the inter-frame bits;
   calculating an average frame voltage for all dominant bits within a frame;
   determining a high average dominant voltage count based on a number of frames for which the average frame voltage is greater than a high voltage threshold; and
   detecting the presence of a ground fault on the two-wire differential bus based on the average frame voltage and the high average dominant voltage count.

2. The method of claim 1, wherein the two-wire differential bus is a controller-area network communications bus (CAN-bus).

3. The method of claim 1, wherein the step of determining whether the predetermined number of bus voltage data points are recessive or dominant bits includes comparing a differential between select voltages from the bus voltage data points with recessive and dominant bit thresholds.

4. The method of claim 3, wherein the differential between select voltages includes calculating a differential between the second voltage measured from the high voltage line of the two-wire differential bus and the first voltage measured from the low voltage line of the two-wire differential bus.

5. The method of claim 1, further comprising determining whether the detected ground fault is a floating ground fault or a ground offset fault.

6. The method of claim 1, wherein the step of detecting the presence of the ground fault based on the average frame voltage and the high average dominant voltage count further includes comparing the average frame voltage to a maximum inter-frame voltage threshold and comparing the high average dominant voltage count to a dominant voltage count threshold.

7. A tool for detecting ground faults in a communications system, wherein the tool includes a computing device configured to execute a method according to claim 1.

8. A method for detecting ground faults on a two-wire differential controller-area network communications bus (CAN-bus) that is installed in a vehicle communications system and that communicatively couples a plurality of electronic control units (ECUs) installed in the vehicle, the method comprising the steps of:
   measuring a predetermined number of bus voltage data points on the CAN-bus using an electronic device that includes an analog to digital converter coupled to the CAN-bus, wherein the CAN-bus is a two-wire differential bus that includes a CAN low voltage line and a CAN high voltage line, and wherein each of the bus voltage data points include a first voltage measured from the CAN low voltage line of the CAN-bus and a second voltage measured from the CAN high voltage line of the two-wire differential CAN-bus;
   determining whether each of the predetermined number of bus voltage data points are recessive or dominant bits based on the first voltage of the CAN low voltage line and the second voltage of the CAN high voltage line;
   identifying which of the predetermined number of bus voltage data points represent inter-frame bits and which represent frame data bits based on whether the predetermined number of bus voltage data points are recessive or dominant;
   calculating a maximum average voltage for the inter-frame bits;
   calculating an average frame voltage for all dominant bits within a frame;

determining a high average dominant voltage count based on a number of frames for which the average frame voltage is greater than a high voltage threshold;

detecting the presence of a ground fault on the CAN-bus of the vehicle based on a comparison between a plurality of thresholds, the average frame voltage, and the high average dominant voltage count.

9. The method of claim 8, wherein the step of determining whether the predetermined number of bus voltage data points are recessive or dominant bits includes comparing a differential between select voltages from the bus voltage data points with recessive and dominant bit thresholds.

10. The method of claim 9, wherein the differential between select voltages includes calculating a differential between the second voltage measured from the CAN high voltage line on the CAN-bus and the first voltage measured from the CAN low voltage line on the CAN-bus.

11. The method of claim 8, further comprising determining whether the detected ground fault is a floating ground fault or a ground offset fault.

12. The method of claim 8, wherein the step of detecting the presence of the ground fault based includes comparing the average frame voltage to a maximum inter-frame voltage threshold and comparing the high average dominant voltage count to a dominant voltage count threshold.

13. A tool for detecting ground faults in a controller-area network communications bus (CAN-bus), wherein the tool includes a computing device configured to execute a method according to claim 8.

* * * * *